United States Patent [19]
Jenq

[11] Patent Number: 5,795,804
[45] Date of Patent: Aug. 18, 1998

[54] METHOD OF FABRICATING A STACK/ TRENCH CAPACITOR FOR A DYNAMIC RANDOM ACCESS MEMORY (DRAM)

[75] Inventor: J.S. Jason Jenq, Pingtung, Taiwan

[73] Assignee: United Microelectronics Corporation, Hsin-Chu, Taiwan

[21] Appl. No.: 731,904

[22] Filed: Oct. 22, 19961

Related U.S. Application Data

[60] Provisional application No. 60/013,303 Mar. 7, 1996.

[51] Int. Cl.[6] ............................................. H01L 21/8242
[52] U.S. Cl. ................................... 438/244; 438/657
[58] Field of Search ............................... 438/243, 244, 438/254, 386, 387, 657

[56] References Cited

U.S. PATENT DOCUMENTS

| | | | |
|---|---|---|---|
| 4,734,384 | 3/1988 | Tsuchiya | 438/244 |
| 5,077,232 | 12/1991 | Kim et al. | 438/244 |
| 5,234,856 | 8/1993 | Gonzales | 438/244 |
| 5,362,664 | 11/1994 | Jun | 438/254 |
| 5,521,111 | 5/1996 | Sato | 438/244 |

*Primary Examiner*—Chandra Chaudhari
*Attorney, Agent, or Firm*—William H. Wright

[57] ABSTRACT

A method is described for making an array of dynamic random access memory (DRAM) cells having both a trench and a stacked capacitor within each cell. The method involves forming a trench in the silicon substrate at the capacitor node contact area of the DRAM cell, and depositing an N+ doped polysilicon layer to form an N+/P diode capacitor in the trench. Another N+ doped polysilicon layer is deposited and anisotropically etched back over a patterned silicon nitride/silicon oxide layer in the trench areas to form the bottom electrodes of stacked capacitors with vertically extending sidewalls. An interelectrode dielectric layer is formed on the bottom electrodes and top electrodes are formed from a patterned N+ doped polysilicon layer to complete the array DRAM trench/stacked capacitors. The trench diode capacitor electrically connected in parallel with the stacked capacitor increase the cell capacitance. The vertical extensions on the stacked capacitor further increase the capacitance of the DRAM cell.

19 Claims, 6 Drawing Sheets

METHOD OF FABRICATING A STACK/TRENCH CAPACITOR FOR A DYNAMIC RANDOM ACCESS MEMORY (DRAM)

This application claims priority from provisional application Ser. No. 60/013,303, filed Mar. 7, 1996.

BACKGROUND OF THE INVENTION

1. Field of the Invention.

This invention relates to a dynamic random access memory (DRAM) device and more particularly to a method of fabricating storage capacitors for DRAM cells having a stacked capacitor or both a stacked capacitor and a trench capacitor connected in parallel in each of the memory cell areas.

2. Description of the Related Art.

Dynamic random access memory (DRAM) devices are widely used in the electronics industry for storing information as binary data. DRAMs are formed on chips, diced from a semiconductor substrate, and consist of an array of memory cells and peripheral circuits for randomly accessing the memory cells to store and retrieve information. Individual memory cells are composed of a single field effect transistor (FET) and a charge storage capacitor. The capacitor is often a trench capacitor formed in the semiconductor substrate or a stacked capacitor built over the cell.

The number of memory cells on a DRAM chip has dramatically increased over the years, approximately quadrupling every three years, and DRAM capacity is expected to reach about 256 Megabits by the year 1998. To facilitate this increase, the area of a memory cell must be significantly reduced in size to maintain a reasonable chip size while maintaining good yield and performance. The dramatic increase in the number of memory cells is a result of improved semiconductor processing technologies, such as higher resolution photolithography and more directional plasma etches. The device minimum feature size on the chip is now less than a half micrometer ($\mu$m) and it is expected to be a quarter micrometer by the year 1998.

To maintain a reasonable DRAM chip size while increasing the number of storage cells on the chip, it is necessary to decrease the horizontal dimensions of the memory cell and therefore to decrease the size of the capacitor that is formed in each cell. However, the reduction in capacitance associated with the physically small capacitor size makes it difficult to maintain an acceptable signal-to-noise level for sensing the charge on the capacitor, and also requires more frequent refresh cycles to retain the charge on these volatile memory cells. There is a continuing need in the industry to maintain or increase the capacitance in each memory cell while reducing the area that the capacitor occupies on the DRAM cell.

Trench storage capacitors formed in the substrate or stacked storage capacitors formed over the substrate are two common approaches for making the memory cell storage capacitors. Of the two approaches, the stacked capacitor has received considerable interest in recent years, because of the variety of ways that the capacitor electrodes can be formed in the vertical (third) dimension over the FET and within the cell area to increase the capacitance while maintaining or reducing the cell area. For example, Jun in U.S. Pat. No. 5,362,664 describes a method for forming a stacked capacitor having a fin-shaped bottom electrode.

Still another approach for increasing the memory cell capacitance is to fabricate both a trench capacitor and a stacked capacitor in the same DRAM cell area, where the trench and stacked capacitors are connected in parallel. For example, Gonzalez in U.S. Pat. No. 5,234,856 describes a method for forming a trench and conventional single plate stacked capacitor concurrently in the same cell area. The Gonzalez stacked-trench capacitor increases the cell capacitance and also makes the memory cell more immune to soft errors caused by high energy particles, such as naturally occurring alpha particles.

Although the above methods increase the capacitance on stacked capacitors for DRAMs there is still a need in the semiconductor industry to provide structure and methods for further increasing the cell capacitance while providing a low cost manufacturing process.

SUMMARY OF THE PREFERRED EMBODIMENTS

It is an object of this invention to provide a new dynamic random access memory cell structure having a new trench capacitor or a new stacked capacitor, with increased capacitance, and a method of fabrication.

It is another object of this invention to increase the capacitance of a stacked capacitor structure by forming vertical extensions on the bottom electrode of the stacked capacitor that further increase the capacitance.

It is still another object of the invention to fabricate these stacked capacitors with a simple process that is manufacturing cost effective.

In accordance with a first aspect, the present invention provides a method for fabricating an array of memory cells. The method provides a silicon substrate, forms a gate oxide layer on device areas for field effect transistors, deposits a first polysilicon layer on the device areas and patterns the first polysilicon layer to form gate electrodes for the field effect transistors. Source/drain areas are formed adjacent to the gate electrodes and the method continues by forming an array of stacked capacitors.

The array of stacked capacitors is formed in this embodiment by depositing a first insulating layer on the patterned first polysilicon layer, and elsewhere on the substrate, and masking and anisotropically etching contact openings in the first insulating layer to storage node junction areas in the source/drain contact areas. A second polysilicon layer is deposited and then first and second spacer layers are deposited on the second polysilicon layer. The first and second spacer layers are patterned by masking and anisotropic etching to leave portions on the second polysilicon layer. The method continues by isotropically etching the first spacer layer to recess the first spacer layer under the second spacer layer. A third polysilicon layer is deposited on the second spacer layer and in the recesses on the first spacer layer, and elsewhere on the second polysilicon layer. The third polysilicon layer is anisotropically etched back to the third insulating layer and further using the patterned third insulating layer as an etch mask. Etching of the second polysilicon layer forms bottom electrodes with vertical portions in the recesses for the stacked capacitors. Remaining portions of the first and second spacer layers are etched to expose more of the bottom electrodes. An interelectrode insulator is formed on the bottom electrodes, a conductive layer is deposited and patterned on the interelectrode insulator to form top electrodes, and processing continues to complete the array of trench/stacked capacitors.

A different aspect of the invention provides a method for fabricating an array of dynamic random access memory cells having trench/stacked capacitors on a silicon substrate. Field oxide regions are formed on the silicon substrate around and electrically isolating an array of device areas for field effect transistors. The method continues by forming a gate oxide layer on the device areas, depositing a first polysilicon layer on the device and field oxide areas and patterning the first polysilicon layer forming gate electrodes on the device areas for the field effect transistors and also electrically conducting portions on the field oxide areas for word lines. Source/drain areas are formed adjacent to the gate electrodes.

In accordance with this aspect, an array of trench/stacked capacitors is formed adjacent field effect transistors by depositing a first insulating layer on the patterned first polysilicon layer and masking and anisotropically etching contact openings in the first insulating layer to storage node junction areas in the source/drain contact areas. The method continues by forming trenches in the silicon substrate and then depositing a doped second polysilicon layer on the first insulating layer and in the trenches, so that the doped second polysilicon layer also contacts the source/drain contact areas in the trenches. A second insulating layer is deposited on the second polysilicon layer and a third insulating layer composed of silicon nitride is deposited on the second insulating layer. The second and third insulating layers are patterned by masking and anisotropic etching to leave portions of the second and third insulating layers on the second polysilicon layer aligned over the trenches. Next, the method isotropically and selectively etches the second insulating layer, thereby recessing the second insulating layer under the patterned third insulating layer. A third polysilicon layer is deposited on the patterned second and third insulating layers and then the third polysilicon layer is anisotropically etched back to the third insulating layer, and further using the patterned third insulating layer as a mask, the second polysilicon layer is patterned to form an array of electrically isolated bottom electrodes for the stacked capacitors with vertical portions in the recesses, and contiguous with the second polysilicon layer in the trenches. The method continues by wet etching remaining portions of the second and third insulating layers, forming an interelectrode insulator on the bottom electrodes, forming top electrodes, and then completing the array of dynamic random access memory cells having trench/stacked capacitors.

According to another aspect, the present invention provides an array of dynamic random access memory (DRAM) cells having trench/stacked capacitors formed on a silicon substrate. Field oxide regions are formed on a P-type silicon substrate around and electrically isolating an array of device areas for field effect transistors and a gate oxide layer covers the device areas. Gate electrodes for the field effect transistors and word lines on top of the field oxide areas are formed from the first polysilicon layer. Lightly doped source/drain areas are formed by ion implantation in the substrate adjacent to the gate electrodes and a conformal sidewall spacer insulating layer forms sidewall spacer on the gate electrodes. Heavily doped source/drain contact areas are formed by ion implantation in the substrate adjacent to the sidewall spacers.

In this embodiment, an array of trench/stacked capacitors includes a first insulating layer composed of silicon oxide on the patterned first polysilicon layer and elsewhere on the substrate, which has contact openings in the first insulating layer to storage node junction areas in the source/drain contact areas. The capacitor array includes trenches in the silicon substrate under the contact openings, with a conformal patterned second polysilicon layer doped with an N-type conductive dopant in the trenches. The patterned second polysilicon layer also extends outward from the trenches over the first insulating layer, forming the bottom electrodes for the array of stacked capacitors. The bottom electrodes also have vertical portions formed from a patterned third polysilicon layer. Out-diffusion of the N-type conductive dopant from the second polysilicon layer into the substrate trenches provides N/P diodes in the trenches. An interelectrode capacitor dielectric layer covers the bottom electrodes, and top electrodes are formed from a patterned doped fourth polysilicon layer on the bottom electrodes having the capacitor dielectric layer.

BRIEF DESCRIPTION OF THE DRAWINGS

The objects and advantages of this invention are best understood with reference to the attached drawings.

DESCRIPTION OF THE PREFERRED EMBODIMENTS

Preferred embodiments of the present invention provide an enhanced capacitance for DRAM charge storage capacitors. Particularly preferred embodiments of the present invention include a stacked capacitor portion of a charge storage capacitor having one or more horizontal fins and at least one vertically extending portion within a lower electrode for the capacitor. The vertically extending portion of the capacitor electrode provides a further enhancement to the capacitance of the conventional stacked capacitor structure. The lower electrode of this charge capacitor may include a portion extending into a trench formed within the substrate of the device.

In a different aspect of the present invention, a DRAM charge storage capacitor includes at least a portion of the bottom electrode formed within a trench in the substrate, where the bottom electrode consists of a conductor in contact with the substrate within the trench. Particularly preferred embodiments provide a metallurgical or other junction at or adjacent to the interface between the conductor and the substrate. For example, a p/n junction may be formed between a P-type substrate and an N-type region formed within the substrate and extending for a distance away from the conductor. The junction capacitance contributes to the overall capacitance of the charge storage capacitor. Alternately, other configurations of p/n junctions or other types of junctions might be formed which provide a capacitance between the substrate and the conductor.

Figure 1:
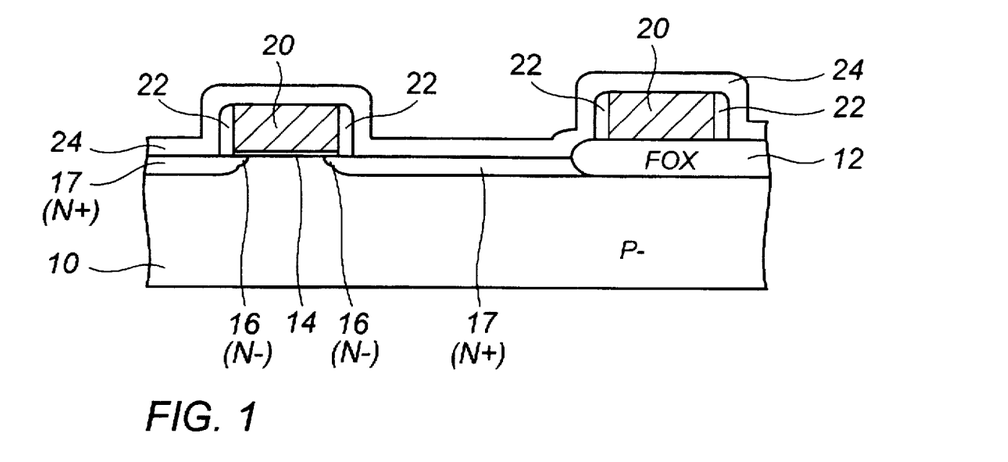
FIGS. 1 through 12 show schematic cross-sectional views of a portion of a DRAM device formed in accordance with this invention. The views illustrate a sequence of process steps for a portion of the DRAM device having a single trench/stacked capacitor and a single field effect transistor (FET).

Now in keeping with the objects of this invention, the method for forming an array of DRAM cells having increased charge storage capacitance is described. Referring to FIG. 1, a schematic cross-sectional view is shown for a DRAM cell partially completed in and on the surface of a substrate 10. The preferred substrate is composed of P-type single crystal silicon having a <100> crystallographic orientation and doped with boron (B) to a dopant concentration of between about $5.0 \times 10^{17}$ to $5.0 \times 10^{18}$ atoms/cm$^3$. A relatively thick Field OXide (FOX) 12 is formed around device areas to electrically isolate the device areas. For simplicity, the drawing shows only a portion of the field oxide 12 to the right of a single device area. Although the field oxide can be formed by various methods, the commonly used method of forming the FOX 12 is the LOCal Oxidation of Silicon (LOCOS), which is now briefly described without showing the individual steps in the figures. The method involves depositing a thin silicon oxide (pad oxide) and a thicker silicon nitride layer (not shown). The nitride layer is patterned by conventional photolithographic means leaving portions of the nitride layer over the planned device areas as a barrier to oxidation. The silicon substrate is then subjected to an oxidizing ambient to form the field oxide 12. Typically the field oxide 12 is between about 3000 to 6000 Angstroms thick.

After removing the silicon nitride layer and the pad oxide layer in a conventional wet etch, the FET devices are formed in the device areas. The most commonly used FET device for the dynamic random access memory cells is the N-channel field effect transistor (FET) having an N+ doped polysilicon gate electrode. The FET is formed by thermally oxidizing the device area to form a thin gate oxide 14. The gate oxide thickness is typically between about 80 to 150 Angstroms. After forming the gate oxide 14, a first polysilicon layer 20 is deposited and patterned by conventional photolithographic techniques and anisotropic plasma etching to form an array of polysilicon strips that form FET gate electrodes 20 on the gate oxide 14 in the device area and also form the interconnecting word lines on the field oxide areas 12. The word lines electrically connect the FET gate electrodes to the peripheral circuits on the DRAM chip. Typically, the first polysilicon layer 20 is deposited by low pressure chemical vapor deposition (LPCVD) using the decomposition of a reactant gas such as silane ($SiH_4$). The first polysilicon layer is then doped by ion implantation using, for example, arsenic ($As^{75}$), and the dopant concentration in the polysilicon after implantation is typically between about $3.0 \times 10^{20}$ to $3.0 \times 10^{21}$ atoms/$cm^3$.

Lightly doped source/drain areas 16 for the N-channel FETs are formed adjacent to the gate electrodes 20, as shown in FIG. 1. The lightly doped source/drain areas are usually formed by ion implanting an N-type dopant, such as arsenic ($As^{75}$), in a manner self-aligned to the gate electrodes by the masking effect of the gate electrodes. A photoresist mask is commonly used to prevent implantation in other areas of the substrate where N-type implants are not desired, such as in P-channel FETs within CMOS circuits in the peripheral areas on the chip. A typical implantation dose for the source/drain areas is between about $5.0 \times 10^{12}$ to $5.0 \times 10^{13}$ atoms/$cm^2$ and the ion implant energy is between about 50 to 100 KeV.

As is also shown in FIG. 1, sidewall spacers 22 are formed on the sidewalls of the gate electrodes 20 by depositing an insulating sidewall spacer material, typically silicon oxide ($SiO_2$), and anisotropically etching back by plasma etching to the top surface of the gate electrodes 20. Heavily N doped source/drain contacts areas 17 are formed in the device areas adjacent to sidewall spacers 22 to provide low resistance ohmic contacts for the FETs. Typically, a second ion implantation is used, for example, using arsenic ($As^{75}$) or phosphorus ($p^{31}$). The sidewall spacers 22 and field oxide 12 serve as an implant mask. Preferably, the dose is between about $1.0 \times 10^{15}$ to $1.0 \times 10^{16}$ ions/$cm^2$ and the implant energy is between about 50 to 100 KeV. After the FETs are completed, the trench/stacked storage capacitors are formed next in and on one of the two source/drain contact areas 17 of each FET in the array of cells. The second source/drain contact in each memory cell is used later for the bit line contacts.

Referring still to FIG. 1, the method for making the array of trench/stacked capacitors includes depositing a first insulating layer 24 over the FETs in the device areas and on the field oxide areas 12. The insulating layer 24 is preferably composed of silicon oxide ($SiO_2$) and is deposited by low pressure chemical vapor deposition (LPCVD) using a reactant gas such as tetraethylorthosilicate (TEOS). The preferred thickness of layer 24 is between about 1000 to 3000 Angstroms.

Figure 2:
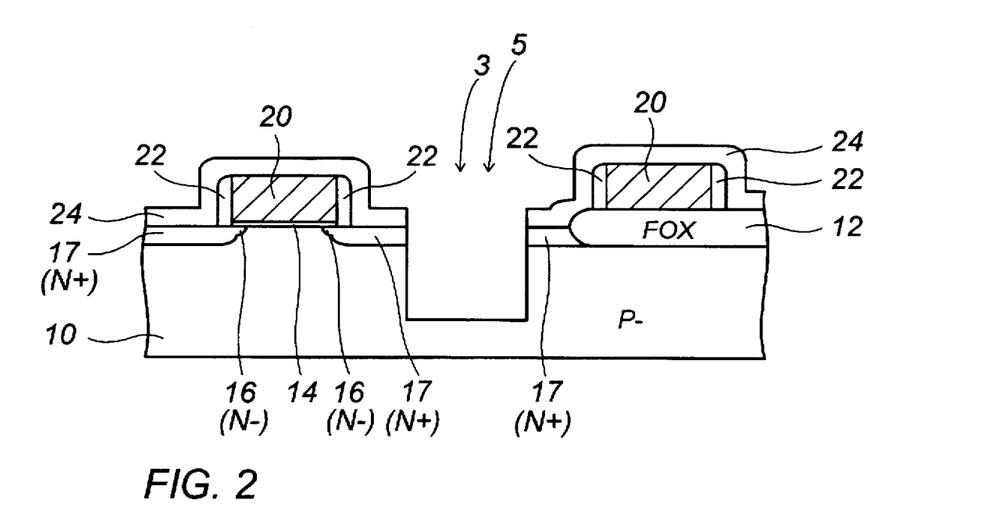

Referring now to FIG. 2, contact openings 3 are etched in layer 24 and, using the same photoresist masking (not shown) and plasma etching, trenches 5 are formed in the silicon substrate 10. Conventional photolithographic techniques are used to pattern the photoresist (not shown), and the plasma etching can be performed, for example, in a model Tel-5000 plasma etcher manufacture by the Applied Materials Corporation of California. The etching is preferably done in a gas mixture of trifluoromethane ($CHF_3$), carbon tetrafluoride ($CF_4$), and argon (Ar) having respective flow rates of about 30, 30 and 230 standard cubic centimeter per minute (sccm). The chamber pressure during etching is preferably about 230 mTorr, and the rf power is about 800 watts. The depth of the trenches are determined by the required capacitance, but would typically have a depth of between about 0.6 to 1.5 μm.

Figure 3:
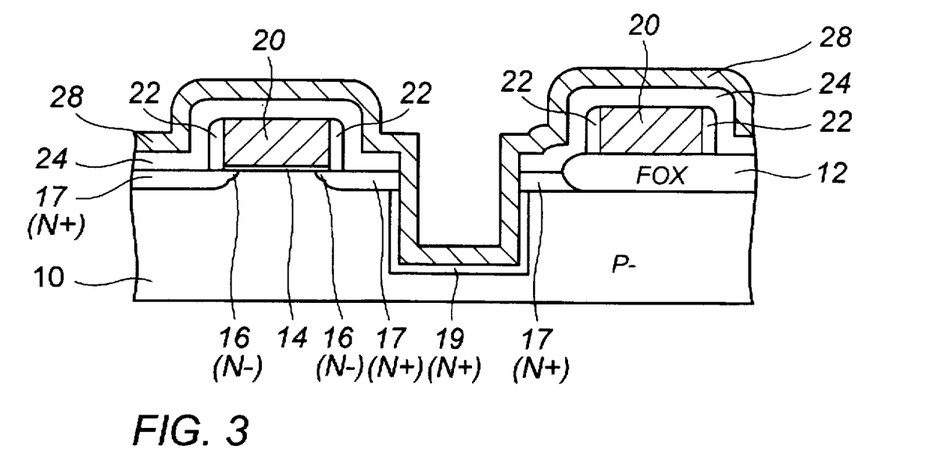

Referring now to FIG. 3, a conformal second polysilicon layer 28 is deposited on the first insulating layer 24. The polysilicon layer 28 is preferably deposited by a low pressure chemical vapor deposition (LPCVD), using for example the decomposition of silane ($SiH_4$), and is in situ doped with an N-type dopant during the deposition by adding to the silane gas a dopant gas such as phosphine ($PH_3$) or arsine ($AsH_3$). The preferred dopant concentration in the second polysilicon layer 28 after in situ doping is typically between about $5.0 \times 10^{20}$ to $5.0 \times 10^{21}$ atoms/$cm^3$. The preferred thickness of the second polysilicon layer 28 is between about 500 to 1500 Angstroms. During the subsequent process the phosphorus or arsenic is diffused into the silicon substrate 10 to form an N+/P diode junction that will increase the capacitance of the trench/stacked capacitor. As depicted in FIG. 3, an N+ diffused region 19 is formed in the substrate surface in the trench areas. As will be seen shortly, portions of the N+ doped polysilicon layer 28 also function as the bottom electrodes for the stacked capacitors so that the capacitance of the junction adds to the capacitance of the trench/stacked capacitor.

Figure 4:
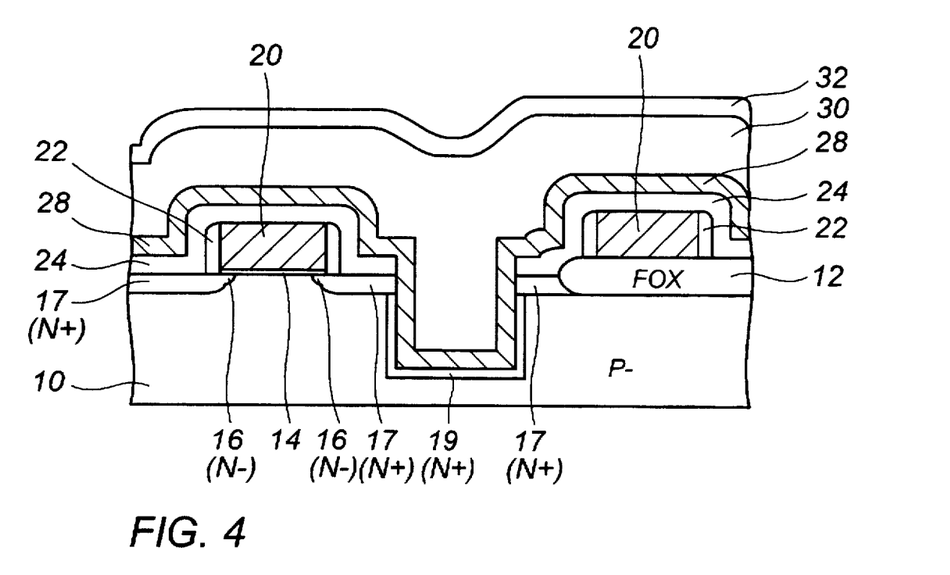

Referring now more specifically to FIGS. 4 through 11, the method of fabricating the stacked capacitors over the trench capacitors is described. As shown in FIG. 4, the method begins by depositing a second insulating layer 30 composed of silicon oxide ($SiO_2$) on polysilicon layer 28 followed by the deposition of a third insulating layer 32 composed of silicon nitride ($Si_3N_4$). The silicon oxide layer 30 is preferably deposited by LPCVD similar to the first insulating layer 24, and is preferably between about 4000 to 6000 Angstroms thick. The silicon nitride 32 is deposited also by low pressure chemical vapor deposition using as the reactant gases, for example, dichlorosilane ($SiCl_2H_2$) and ammonia ($NH_3$) at a temperature of about 700° to 800° C. The preferred thickness of the nitride layer 32 is between about 500 to 2000 Angstroms.

Figure 5:
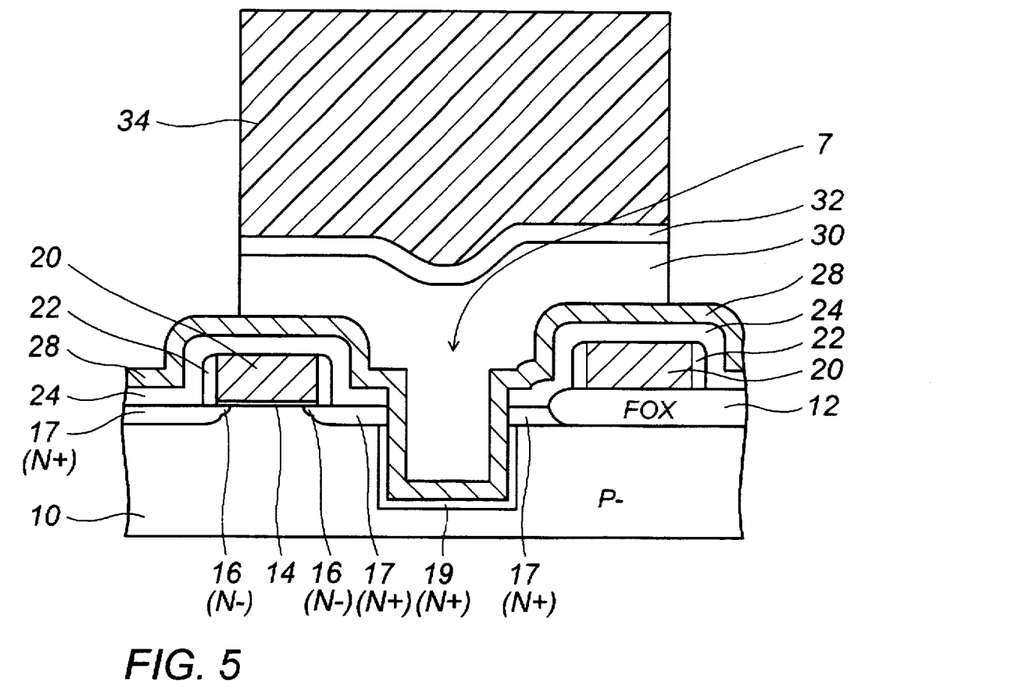

The second and third insulating layers 30 and 32 are patterned using a conventional photoresist mask 34, as shown in FIG. 5, and anisotropic plasma etching to form a vertical walled structure. The anisotropic etching can be performed in a Reactive Ion Etcher (RIE) using, for example, carbon tetrafluoride ($CF_4$) and argon (Ar) as the etching gas mixture, or alternatively hydrogen ($H_2$) can be added to the gas mixture or trifluoromethane ($CHF_3$) to improve the etch selectivity of the oxide layer 30 to polysilicon layer 28. However, as will become apparent later, the thickness of the remaining polysilicon layer 28 after patterning is not a critical condition since layer 28 is later completely removed in these etched areas. As shown in FIG. 5, the silicon nitride/silicon oxide layers 32 and 30 are patterned to leave portions over the trenches 7 and the desired stacked capacitor areas, having essentially vertical sidewalls.

Figure 6:
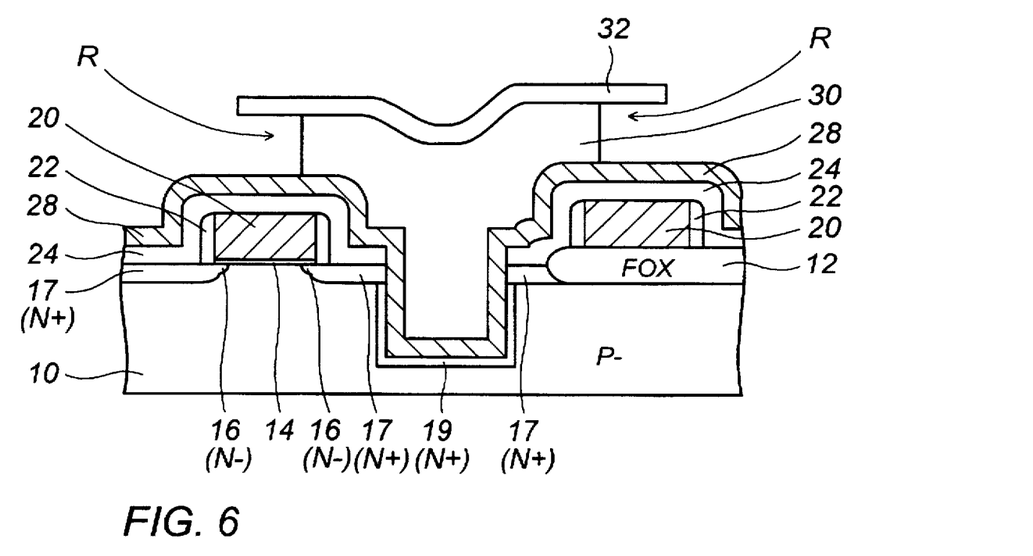

After removing the photoresist mask 34 by conventional means, such as plasma ashing in oxygen or stripping in ozone, the patterned silicon oxide layer 30 is isotropically etched in a 6:1 solution of buffered hydrofluoric acid (40% $NH_4F$:49% HF) to selectively remove a portion of the oxide under the patterned silicon nitride layer 32, thereby forming recesses R, as shown in FIG. 6.

Figure 7:
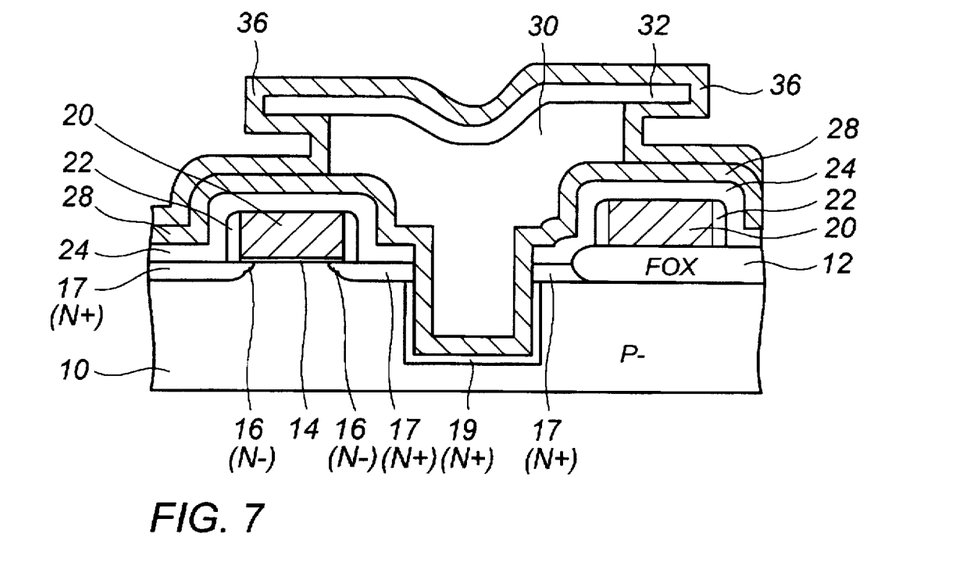

Referring now to FIG. 7, a third polysilicon layer 36 is deposited, conformally coating the patterned silicon nitride layer 32 and the sidewalls of the silicon oxide layer 30 within the recesses. The polysilicon layer 36 also deposits on the exposed portions of the second polysilicon layer 28, and the deposition under the silicon nitride 32 is of particular importance because it provides a contact to layer 28 after layer 28 is patterned. Preferably, layer 36 is between about 1000 to 3000 Angstroms thick, and is also deposited by LPCVD using silane. The layer is heavily doped with an N-type dopant, such as phosphorus (P), by in situ doping. The preferred dopant concentration in polysilicon layer 36 is between about $5.0\times10^{20}$ to $3.0\times10^{21}$ atoms/cm$^3$.

Figure 8:
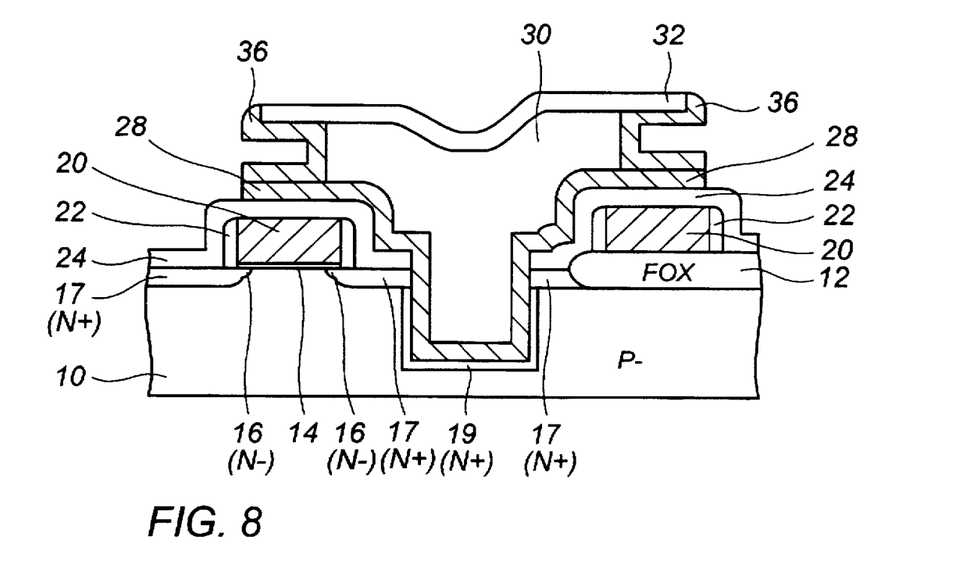

An anisotropic plasma etch is now used to etch back the third polysilicon layer 36 to the silicon nitride layer 32 and then the etch back is continued, using the nitride layer 32 and masking effect of the polysilicon sidewall on layer 32 to mask the etching while the exposed second polysilicon 28 is etched to the first insulating layer 24, as shown in FIG. 8. This etch back results in the formation of an array of bottom electrodes formed from polysilicon layer 28 having vertical portions formed from polysilicon layer 36.

Figure 9:
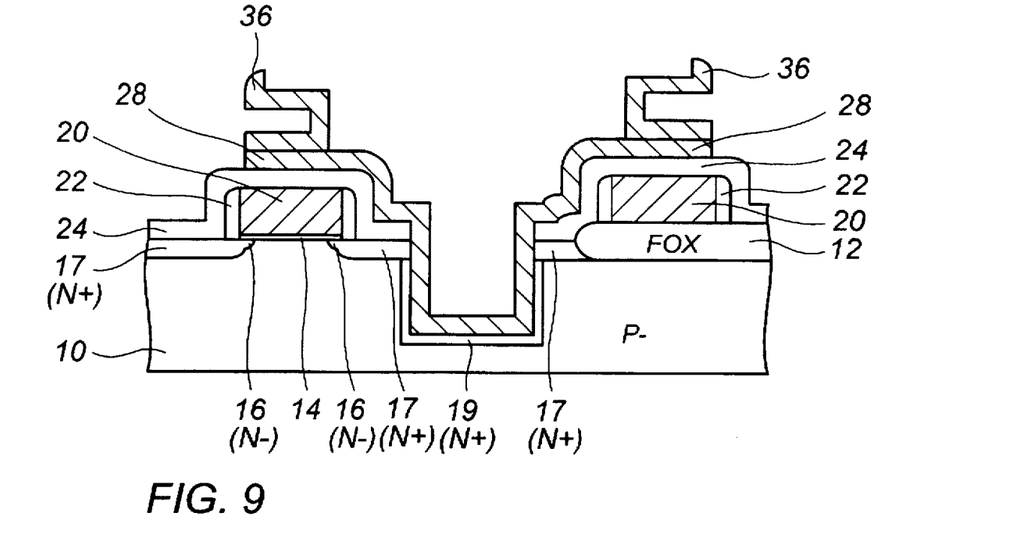

Referring now to FIG. 9, the remaining portions of the silicon nitride layer 32 and oxide layer 30 are removed, leaving a free standing bottom electrode for the stacked capacitor formed from polysilicon layers 28 and having vertical extensions formed from layer 36. The bottom electrode also extends into the trench, further increasing the electrode area for the stacked capacitor while also serving as the node contact for the trench capacitor (i.e., the junction capacitance of the N+/P diode). The silicon nitride layer 32 is preferably removed using a conventional hot phosphoric acid etch, and the silicon oxide layer 30 is removed using an HF or buffered HF etch solution.

Figure 10:
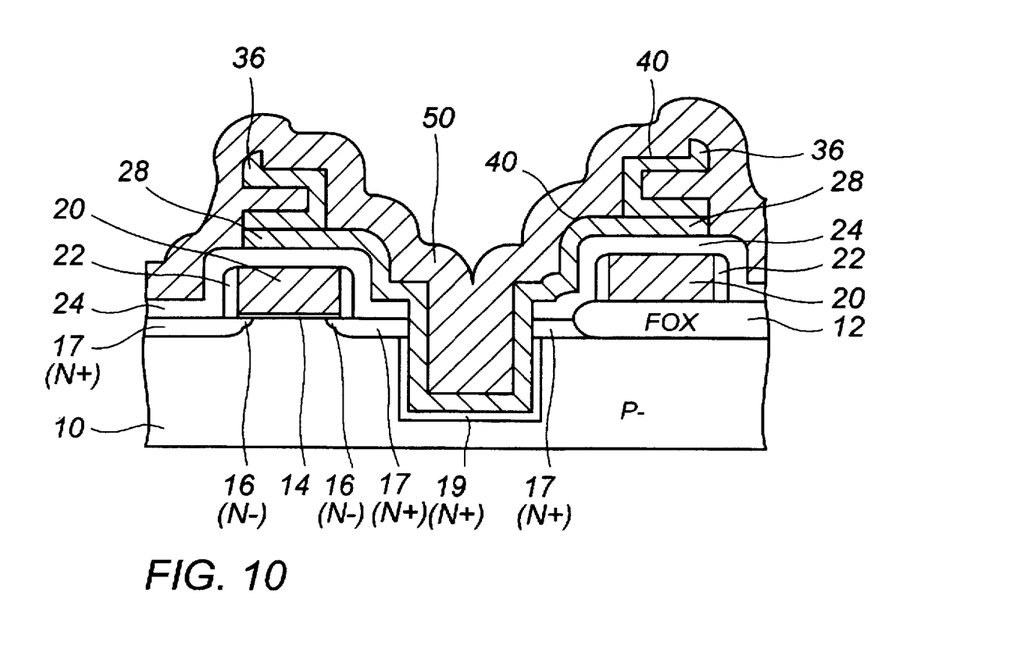
Figure 11:
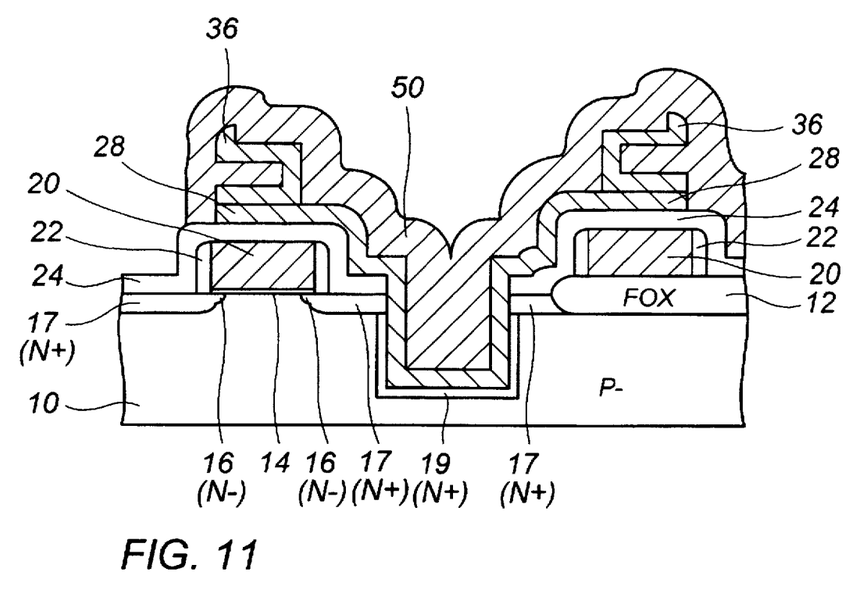

Referring to FIGS. 10 and 11, the trench/stacked storage capacitors are now completed by forming a capacitor dielectric layer 40 having a high dielectric constant on the surface of the bottom electrodes (layer 28 and 32) and then depositing a fourth polysilicon layer 50 to form the top capacitor electrodes and complete the storage capacitors for the array of DRAM cells of this invention. The dielectric layer 40 is very thin to provide the highest capacitance possible. To simplify the drawing, the dielectric layer 40 is indicated in FIG. 9 by pointing to the surface of layers 28 and 32.

Typically, the capacitor dielectric layer 40 is composed of a material having a high dielectric constant and is most preferably pin hole free. One type of high dielectric constant material is silicon nitride which is typically used as a capacitor dielectric in the form of a multilayer material composed of silicon oxide - silicon nitride - silicon oxide (ONO). Typically, the thickness of layer 40 is between about 40 to 100 Angstroms. Alternatively, other high dielectric constant materials can be used. For example, tantalum pentoxide is another high dielectric material that is currently being developed in the industry for capacitor dielectric layers.

Also shown in FIG. 10, a conformal fourth polysilicon layer 50 is deposited over the capacitor dielectric layer 40, which also fills the recesses R in the stacked portion of the capacitor and the trench portion 7 of the capacitor. Layer 50 is now patterned by conventional photolithographic techniques and anisotropic etching to form the top capacitor electrode 50, as shown in FIG. 11. The thickness of polysilicon layer 50 is between about 1000 to 3000 Angstroms. The deposition is achieved in a LPCVD reactor using, for example, the decomposition of silane ($SiH_4$).

Figure 12:
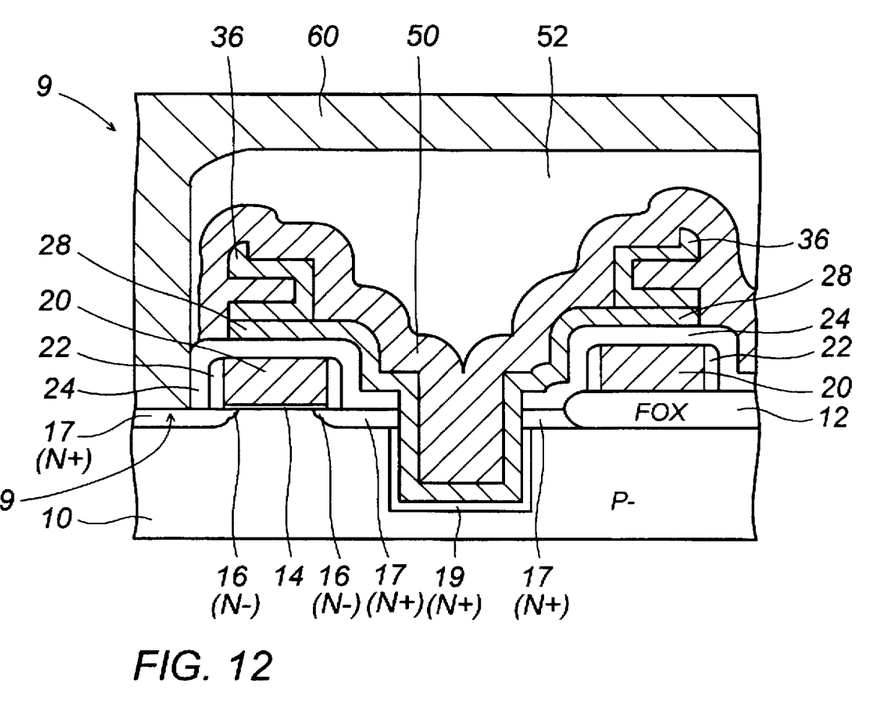

For completeness, the formation of the remaining DRAM circuit up to and including the first level interconnection metallurgy is shown in FIG. 12. A fifth insulating layer 52, typically composed of borophosphosilicate glass (BPSG), is preferably deposited by atmospheric pressure chemical vapor deposition (APCVD) to a thickness of between about 4000 to 7000 Angstroms. The BPSG is then annealed to essentially planarize the BPSG surface. Photoresist masking and plasma etching (not shown) are used to form the bit line contact openings 9, as depicted in FIG. 12, to the second source/drain contact of each FET in the array of memory cells. The contact is etched through the BPSG layer and the first insulating layer 24 (silicon oxide) using an appropriate anisotropic plasma etching. A fifth polysilicon layer 60 is deposited, doped N-type, and then etched to form the bit line metallurgy and the bit line contacts. Alternatively, a silicide layer can be formed on the fifth polysilicon layer to increase its electrical conductivity. The preferred method is to deposit a thin metal layer, such as tungsten, followed by a low temperature anneal to form tungsten silicide ($WSi_x$). The polysilicon/silicide bit line wiring is then formed by conventional plasma etching using a photoresist mask to complete the DRAM circuit up to the first level interconnect. Still another method is to form refractory metal plugs in the contact openings and use an aluminum (Al) or an aluminum-copper (Al/Cu) alloy in the wiring lines.

It should be well understood by one skilled in the art that by including additional process steps not described above, other types of devices can also be included on the DRAM chip. For example, by providing N-well regions in the P-substrate, P-channel FETs can also be fabricated, and CMOS circuits can be built out of the N-channel and P-channel FETs. It should be further understood that these peripheral CMOS circuits are built at the same time and with the same mask set used to fabricate the array of DRAM cells, and provide random access to the memory cells and to read out and write in information by sensing and storing charge on the capacitors, respectively. In addition, the structures and methods described herein could be applied to a variety of semiconductor devices which incorporate charge storage capacitors or other types of capacitors.

While the invention has been particularly shown and described with reference to the preferred embodiments thereof, it should be understood by those skilled in the art that various changes in form and details may be made without departing from the spirit and scope of the invention.

What is claimed is:

1. A method for fabricating an array of memory cells, comprising the steps of:

providing a silicon substrate;

forming a gate oxide layer on device areas for field effect transistors;

depositing a first polysilicon layer on the device areas and patterning the first polysilicon layer to form gate electrodes for the field effect transistors;

forming source/drain areas adjacent to the gate electrodes; and forming an array of stacked capacitors by:

depositing a first insulating layer on the patterned first polysilicon layer, and elsewhere on the substrate, masking and anisotropically etching contact openings in the first insulating layer to storage node junction areas in the source/drain contact areas, depositing a second polysilicon layer, depositing a first spacer layer on the second polysilicon layer, depositing a second spacer layer on the first spacer layer, patterning the first and second spacer layers by masking and anisotropic etching to leave portions on the second polysilicon layer, isotropically etching the first spacer layer and thereby recessing the first spacer layer under the second spacer layer, depositing a third polysilicon layer on the second and in the recesses on the first spacer layers, and elsewhere on the second polysilicon layer, anisotropically etching back the third polysilicon layer to the third insulating layer, and etching further using the patterned third insulating layer as an etch mask, etching the second polysilicon layer to form bottom electrodes for the stacked capacitors with vertical portions in the recesses, etching remaining portions of the first and second spacer layers to expose more of the bottom electrodes, forming an interelectrode insulator on the bottom electrodes, depositing and patterning a conductive layer on the interelectrode insulator, forming top electrodes, and completing the array of stacked capacitors.

2. The method of claim 1, wherein the thickness of the second polysilicon layer is between about 500 to 1500 Angstroms.

3. The method of claim 1, wherein the second polysilicon layer is doped with an N-type dopant, having a concentration between about $5.0 \times 10^{20}$ to $5.0 \times 10^{21}$ atoms/cm$^3$.

4. The method of claim 1, wherein the thickness of the first insulating layer is between about 4000 to 6000 Angstroms.

5. The method of claim 1, wherein the thickness of the first spacer layer is between about 500 to 2000 Angstroms.

6. The method of claim 1, wherein the first spacer layer is recessed under the second spacer layer to a distance of between about 3000 to 5000 Angstroms.

7. The method of claim 1, wherein the isotropic etch of the first spacer layer is performed in a solution containing hydrofluoric acid (HF) and water (H$_2$O).

8. The method of claim 1, wherein the thickness of the conformal third polysilicon layer is between about 1000 to 3000 Angstroms.

9. The method of claim 1, wherein the interelectrode capacitor dielectric layer is silicon oxide/silicon nitride/silicon oxide (ONO) having a thickness of between about 40 to 100 Angstroms.

10. The method of claim 1, wherein the conductor is doped polysilicon between about 2000 to 4000 Angstroms thick.

11. The method of claim 1, further comprising the step of forming an array of trenches in the silicon substrate beneath the bottom electrode so that the second polysilicon layer extends into a corresponding one of the trenches.

12. A method for fabricating an array of dynamic random access memory cells having trench/stacked capacitors on a silicon substrate, comprising the steps of:

providing a silicon substrate;

forming field oxide regions on the silicon substrate around and electrically isolating an array of device areas for field effect transistors;

forming a gate oxide layer on the device areas;

depositing a first polysilicon layer on the device and field oxide areas;

patterning the first polysilicon layer forming gate electrodes on the device areas for the field effect transistors and also electrically conducting portions on the field oxide areas for word lines;

forming source/drain areas adjacent to the gate electrodes; and forming an array of capacitors by:

depositing a first insulating layer on the patterned first polysilicon layer, masking and anisotropically etching contact openings in the first insulating layer to storage node junction areas in the source/drain contact areas, and further forming trenches in the silicon substrate, depositing a doped second polysilicon layer on the first insulating layer and in the trenches, the doped second polysilicon layer also contacting in the trenches the source/drain contact areas, depositing a second insulating layer on the second polysilicon layer, depositing a third insulating layer composed of silicon nitride on the second insulating layer, patterning the second and third insulating layers by masking and anisotropic etching leaving portions on the second polysilicon layer aligned over the trenches, isotropically and selectively etching the second insulating layer and thereby recessing the second insulating layer under the patterned third insulating layer, depositing a third polysilicon layer on the patterned second and third insulating layers, anisotropically etching back the third polysilicon layer to the third insulating layer, and further using the patterned third insulating layer as a mask, patterning the second polysilicon layer and thereby forming an array of electrically isolated bottom electrodes for the stacked capacitors with vertical portions in the recesses, and contiguous with the second polysilicon layer in the trenches, removing by isotropic wet etching remaining portions of the second and third insulating layers, forming an interelectrode insulator on the bottom electrodes, forming top electrodes, and completing the array of dynamic random access memory cells having capacitors.

13. The method of claim 12, wherein the thickness of the second polysilicon layer is between about 500 to 1500 Angstroms.

14. The method of claim 12, wherein the second polysilicon layer is doped with an N-type dopant, having a concentration between about $5.0 \times 10^{20}$ to $5.0 \times 10^{21}$ atoms/cm$^3$.

15. The method of claim 12, wherein the thickness of the first insulating layer is between about 4000 to 6000 Angstroms.

16. The method of claim 12, wherein the thickness of the second insulating layer is between about 500 to 2000 Angstroms.

17. The method of claim 12, wherein the first insulating layer is recessed under the second insulating layer to a distance of between about 3000 to 5000 Angstroms.

18. The method of claim 12, wherein the isotropic etch of the second insulating is performed in a solution containing hydrofluoric acid (HF) and water (H$_2$O).

19. The method of claim 12, wherein the doped second polysilicon layer forms an N/P diode with the silicon substrate within the trench, wherein under reverse bias the capacitance of the N/P diode is electrically connected in parallel with the stacked capacitor to provide increased capacitance for the array of DRAM cells.

* * * * *